United States Patent
Schorn et al.

(10) Patent No.: US 11,584,764 B2
(45) Date of Patent: Feb. 21, 2023

(54) PRODUCTION OF TRIALKYLINDIUM COMPOUNDS IN THE PRESENCE OF CARBOXYLATES

(71) Applicant: Umicore AG & Co. KG, Hanau-Wolfgang (DE)

(72) Inventors: Wolf Schorn, Waldbronn (DE); Ralf Karch, Kleinostheim (DE); Annika Frey, Hanau (DE); Angelino Doppiu, Seligenstadt (DE); Andreas Rivas Nass, Bensheim (DE); Eileen Woerner, Nidderau (DE)

(73) Assignee: Umicore AG & Co. KG, Hanau-Wolfgang (DE)

( * ) Notice: Subject to any disclaimer, the term of this patent is extended or adjusted under 35 U.S.C. 154(b) by 410 days.

(21) Appl. No.: 16/616,553

(22) PCT Filed: May 25, 2018

(86) PCT No.: PCT/EP2018/063820
§ 371 (c)(1),
(2) Date: Nov. 25, 2019

(87) PCT Pub. No.: WO2018/219823
PCT Pub. Date: Dec. 6, 2018

(65) Prior Publication Data
US 2021/0163502 A1    Jun. 3, 2021

(30) Foreign Application Priority Data
May 29, 2017    (EP) ..................... 17173318

(51) Int. Cl.
C23C 16/18    (2006.01)
C07F 5/00    (2006.01)

(52) U.S. Cl.
CPC ............... C07F 5/00 (2013.01); C23C 16/18 (2013.01)

(58) Field of Classification Search
CPC .................... C07F 5/00; C23C 16/18
See application file for complete search history.

(56) References Cited

U.S. PATENT DOCUMENTS

| | | | |
|---|---|---|---|
| 5,756,786 A | 5/1998 | Power et al. | |
| 5,817,847 A | 10/1998 | Giolando | |
| 6,770,769 B2 | 8/2004 | Shenai-Khatkhate et al. | |
| 9,617,284 B2 | 4/2017 | Sundermeyer et al. | |
| 2001/0021785 A1 | 9/2001 | Baum et al. | |
| 2003/0191333 A1 | 10/2003 | Shenai-Khatkhate et al. | |
| 2006/0047132 A1* | 3/2006 | Shenai-Khatkhate | C07F 5/064 556/1 |
| 2014/0287141 A1* | 9/2014 | Karch | C23C 16/18 427/252 |

FOREIGN PATENT DOCUMENTS

| | | |
|---|---|---|
| CN | 103254248 A | 8/2013 |
| JP | 62-211385 A | 9/1987 |
| JP | 01-100178 A | 4/1989 |
| JP | 2002-538082 A | 11/2002 |
| JP | 2006-104189 A | 4/2006 |
| JP | 2008-184419 A | 8/2008 |
| JP | 2013-067608 A | 4/2013 |
| JP | 2016-536325 A | 11/2016 |
| SU | 375293 A1 | 3/1973 |
| SU | 417429 A1 | 2/1974 |
| TW | 201434847 A | 9/2014 |
| WO | WO-2014093419 A1 | 6/2014 |
| WO | WO-2014099171 A1 | 6/2014 |
| WO | WO-2015024894 A1 | 2/2015 |

OTHER PUBLICATIONS

International Search Report for PCT/EP2018/063820 dated Jul. 3, 2018.
Written Opinion of the International Searching Authority for PCT/EP2018/063820 dated Jul. 3, 2018.

* cited by examiner

*Primary Examiner* — Elizabeth A Burkhart
(74) *Attorney, Agent, or Firm* — Faegre Drinker Biddle & Reath LLP

(57) ABSTRACT

The invention relates to methods for the production of trialkylindium ($InR_3$), wherein the production takes place in a reaction mixture that contains at least one alkylindium halide, a trialkylaluminum ($AlR_3$), a carboxylate, and a solvent, wherein R is chosen independently of one another from C1-C4 alkyl, and X is chosen independently of one another from Cl, Br, and I.

19 Claims, No Drawings

PRODUCTION OF TRIALKYLINDIUM COMPOUNDS IN THE PRESENCE OF CARBOXYLATES

CROSS-REFERENCE TO RELATED APPLICATIONS

This application is a national stage application (under 35 U.S.C. § 371) of PCT/EP2018/063820, filed May 25, 2018, which claims benefit of European Application No. 17173318.1, filed May 29, 2017, both of which are incorporated herein by reference in their entirety.

The invention relates to methods for producing trialkylindium, wherein the production takes place in a reaction mixture that contains at least one alkylindium halide, a trialkylaluminum, a carboxylate, and a solvent, wherein the alkyl groups on the indium and aluminum are chosen independently of one another from C1-C4 alkyl; in particular, the invention relates to a method for producing trialkylindium ($InR_3$), wherein the production takes place in a reaction mixture that contains at least one alkylindium halide, a trialkylaluminum ($AlR_3$), a carboxylate, and a solvent, wherein the alkyl groups R on the indium and aluminum are chosen independently of one another from C1-C4 alkyl, and the halides of the alkylindium halide are chosen independently of one another from Cl, Br, and I.

Trialkylindium compounds—in particular, trimethylindium and triethylindium—are used in metallo-organic chemical vapor deposition (MOCVD) as precursor compounds (precursors) for the production of indium-based layers. The method serves, in particular, for the production of semiconductors. In the method, gaseous precursor compounds are directed into a reaction chamber in which they react among one another or with additional substances, and the reaction products are deposited onto a substrate. Trialkylindium compounds are crystalline, sublimable, or liquid, distillable compounds that are pyrophoric, and thus ignite spontaneously in the presence of air.

With the use of trimethylindium as a precursor compound in MOCVD methods, the problem exists that even slight polar contaminants—in particular, oxygen, but also nitrogen or phosphorus—may inactivate ("poison") the products. For semiconductor applications, even oxygen contamination in the ppm range is unacceptable. This entails that particular methods for the production of trimethylindium must be provided in which oxygen and other contaminants are nearly entirely avoided.

Classical methods for the production of trialkylindium are the Grignard reaction of indium, magnesium, and alkyl halides; salt elimination reactions of indium(III) chloride and methyllithium; and transmetalation reactions of indium and metal alkyl compounds. Such methods are generally unsuitable for the production of trialkylindium for MOCVD process, because trialkylindium cannot be provided in the necessary purity. This is due to the fact that such methods require polar solvents such as ether. These have a relatively high affinity to indium, which leads to complexings and to the contamination of the product with oxygen compounds.

In order to solve the problem of such contaminants, in the prior art, various methods have been proposed that require no oxygen-containing solvents. WO2014/093419 thus proposes to react a precursor compound $R_3M_2X_3$, where R=alkyl and M=gallium, indium, or thallium, with a reducing agent. In particular, hydrocarbons are used as solvents. It is thereby disadvantageous that elementary sodium is used as a reactant. Sodium is extremely reactive, difficult to handle, and regularly leads to unwanted secondary reactions. The use of elementary sodium is hazardous, especially in a mixture with pyrophoric organometallic compounds, such as alkyl metal educts and products, and is less suitable for industrial applications. Only methods with gallium compounds are described in the exemplary embodiments. However, the reactivity of gallium and indium is very variable in such reactions, which involve complexes with halogens and alkyl groups. The yields are low, insofar there are any at all. The yield is also examined by NMR only in a crude reaction mixture, and thus without separation of the product. It is therefore unclear whether the product may be separated at all, let alone in what quantity and purity.

US2006/0047132 A1 discloses various methods for producing organometallic compounds—in particular, based upon gallium, indium, aluminum, and zinc—from a plurality of precursor compounds. The method is performed in the presence of tertiary amines or tertiary phosphines that form adducts with metals, and are thereby to support the formation of the desired products. It is thereby disadvantageous that the low-molecular nitrogen- and phosphorous-containing compounds that are used contaminate the products, whereby uses of the products for semiconductor manufacturing by means of MOCVD are precluded. A purification of the products via sublimation is not possible, or is possible only to an insufficient extent, because the boiling point of the low-molecular tertiary amines or phosphines that are used is relatively low. In example 12 (the sole example in which an indium alkyl compound is specifically produced), it is, accordingly, specified that the attempt at the isolation of the product in a vacuum was unsuccessful. The crude reaction product, which contains trimethylindium, the amine base adduct, and the solvent, therefore could be examined only by means of NMR. Such a method is obviously not usable in practice, or is usable only to a limited extent, if high purity products without contaminants are required. Moreover, two theoretical examples 7 and 8 for the production of trimethylindium are disclosed. It is claimed that a good result would be expected. This is implausible because the problem of separation of the trimethylindium from the crude reaction product that is described in example 12 is not solved. It is therefore not to be expected that a good yield would be obtained according to the speculative examples 7 or 8, let alone that a product with the necessary purity might be obtained. Rather, it is to be expected that the methods for producing high purity trimethylindium are unsuitable for MOCVD processes.

WO2014/099171 describes methods for producing trialkylindium compounds from indium carboxylates and alkyl aluminum compounds. The reaction yields of sublimated trimethylindium are, at approximately 50 to 55%, low. It is also disadvantageous that low-molecular components, such as isohexane or triacetate, which lead to a contamination of the product in the sublimation, are present in the reaction mixtures. In one method variant, the low-molecular solvent is replaced after the reaction by a higher-boiling solvent, whereby the method is relatively involved.

WO2015/024894 discloses a method for producing trialkylindium from precursor compounds of the formula $R_3In_2Cl_3$, wherein R is an alkyl group having 1 to 4 carbon atoms. The reaction takes place in a multi-stage method in which a lithium tetraalkylindate is first produced with alkyllithium, which lithium tetraalkylindate is subsequently reacted with an indium chloride component. Although the yields are relatively high, it would, in principle, be desirable to provide a simpler method. Also, diethyl ether is used in the method, which may lead to oxygen contamination of the product via the formation of adducts.

U.S. Pat. Nos. 5,756,786 and 6,770,769 B2 relate to methods for the production of trimethylindium from indium trichloride and trimethylaluminum in the presence of potassium fluoride. The yields are approximately 56%, and therefore are in need of improvement. The secondary product, dimethylaluminum fluoride, has a relatively low boiling point, and therefore, in the purification of the product in vacuum, occurs as a contaminant. A high excess of potassium fluoride is used in the method. In general, the handling of fluorides in industrial processes is problematic, since the preparation is complicated and cost-intensive. The reaction residues must also be deactivated in a costly manner, because portions of the secondary products, such as $K[Me_2AlF_2]$, exhibit a high reactivity. An additional disadvantage is that the solid educts, $InCl_3$ and KF, have polymer structures. Therefore, they are insoluble or only poorly soluble in the nonpolar solvent, squalane. Therefore, the reaction must be performed at relatively high temperatures above 100° C., which leads to safety problems in light of the exothermic reaction and the pyrophoric compounds that are used. In addition to this, the reaction may be only insufficiently monitored due to the poorly soluble educts which are present, distributed inhomogeneously as solids. The method is also relatively inefficient, because a high (3-fold) molar excess of the aluminum compound, relative to the indium compound, is necessary. For the cited reasons, the method is hardly suitable to being applied industrially.

Overall, a need thus exists for novel, efficient, and simple methods for producing trialkylindium at high yield and purity.

It is the aim of the invention to provide a method which overcomes the disadvantages described above. A method for the production of trialkylindium shall be provided in which the product is obtained at a high yield and high purity. In particular, it should be avoided that unwanted contaminants enter into the product which have a disadvantageous effect upon subsequent processes, such as MOCVD applications. In particular, contaminants with oxygen, but also with nitrogen, phosphorus, or other metals, should be avoided. It should be possible to perform the method as simply as possible, and in as few reaction steps as possible. The starting materials should be as simple as possible and available in large quantities, and should be as easy to handle as possible. Overall, it should be possible to perform the method as simply, efficiently, and cost-effectively as possible.

Surprisingly, the aim upon which the invention is based is achieved by a process according to the claims.

The subject matter of the invention is a method for the production of trialkylindium, wherein the production takes place in a reaction mixture that contains at least one alkylindium halide, a trialkylaluminum, a carboxylate, and a solvent.

The alkyl groups are chosen independently of one another from C1-C4 alkyl. The alkyl groups may be linear or branched. It is thereby especially preferred that the alkyl groups be chosen from methyl or ethyl. The alkyl group is especially preferably methyl.

The educts, alkylindium halide and trialkylaluminum, have alkyl groups. These may be chosen independently of one another, and thus be different. However, it is especially preferred that all alkyl groups in the reaction mixture be identical. This means that both the alkylindium halide and the trialkylaluminum have the same alkyl groups, so that a trialkylindium with identical alkyl groups is obtained. A reaction is especially preferred in which a methylindium halide and trimethylaluminum are used to produce trimethylindium. A reaction is likewise preferred in which an ethylindium halide and triethylaluminum are used to produce triethylindium.

The alkylindium halide preferably has a halide that is chosen from fluoride, chloride, iodide, and bromide. The halide is, especially preferably, chloride. In such reactions, chloride is generally preferable, since the corresponding compounds are available in a relatively simple manner and cost-effectively.

In a preferred embodiment, the halide is chloride, and/or the alkyl is methyl. It is especially preferable that the halide be chloride and the alkyl be methyl. In this embodiment, the invention relates to a method for producing trimethylindium from a reaction mixture that contains a methylindium chloride and trimethylaluminum.

The reaction mixture contains at least one alkylindium halide. What is referred to by the generic term, "alkylindium halide," is a group of compounds of the formula $R_aIn_bX_c$ that consists of indium, alkyl, and halogen. The term therefore does not mean that alkyl, indium, and halide are present in a ratio of 1:1:1. In alkylindium halides, the metal indium forms, with the alkyl- and halide groups, a metallo-organic complex or a salt thereof. In general, such metallo-organic indium halides are often present as a mixture of various compounds that are at equilibrium with one another. The molar ratios a:b:c of alkyl, indium, and halide are thereby overall often not whole numbers, and they may also vary depending upon the concrete production method. Rather, the compounds are polymers with variable structures. The concrete structures are thereby in part unknown, since they have not yet been entirely clarified in the prior art. According to the invention, however, it is essential that an organometallic complex be used that has alkyl and halide groups. The molar ratios may be determined without additional measures via elementary analysis or NMR tests.

In a preferred embodiment, the alkylindium halide has the formula $R_aIn_bX_c$, wherein R is chosen from C1-C4 alkyl; wherein X is chosen from Cl, Br, and I; and wherein a=1-2, b=1, and c=1-2. R=methyl or ethyl, and X=Cl, is thereby preferred. The molar substance amount ratios of R:In:X may thus vary between 1:1:2 and 2:1:1. In practice, such alkylindium halides are also described as mixtures of compounds of the formulas, $R_2InX$ and $RInX_2$. In these compounds, the specific compositions also often vary within the cited ranges, wherein the specific stoichiometry depends upon the production method.

In a preferred embodiment, the alkylindium halide is an alkylindium sesquichloride ($R_3In_2Cl_3$). The compound $R_3In_2Cl_3$ may also be described as an equimolar mixture of $R_2InCl$ and $RInCl_2$. In practice, such compounds normally are not present in precisely the indicated ideal molar ratio. For example, it has thus been found that the molar ratio of methyl to chloride in the methylchloride compounds may be at approximately 2:3. The total formula may thereby be specified as $Me_{2.4}In_2Cl_{3.6}$.

Methods for producing alkylindium halides are known in the prior art. They are often based upon the reaction of indium halides with alkyl halides. The production of alkylindium sesquichloride is described in WO2015/024894A1, for example. Additional methods are disclosed in Gynane et al., J. Organomet. Chem., 40, 1972, C9-C10, or Gynane et al., J. Organomet. Chem., 81, 1974, 329-334. In U.S. Pat. No. 5,817,847, the reaction of MeCl with molten indium is described, wherein $MeInCl_2$ or $Me_2InCl$ is obtained (Me=methyl), depending upon the reaction time.

The reaction mixture has at least one trialkylaluminum, wherein alkyl is preferably methyl or ethyl. Trialkylaluminum compounds are organometallic compounds of the general formula $AlR_3$. Such compounds are generally present as dimers or polymers in which each aluminum atom is coordinated more than three times. In the method according to the invention, trialkylaluminum serves to provide alkyl groups for reaction with the indium compound. Overall, in the reaction, alkyl groups transfer from the aluminum compound to the indium compound. Such methods are also referred to as transalkylation.

The reaction mixture has at least one carboxylate. Salts of carboxylic acid are referred to as carboxylates. Carboxylic acids are organic compounds that carry one or more carboxyl groups (—COOH). An ionic compound is thus contained that has at least one deprotonated carboxyl group. A carboxylate salt is preferably added to the reaction mixture, which carboxylate salt at least partially dissociates in the reaction mixture. It is also conceivable to use a carboxylic acid that is at least partially neutralized in the reaction mixture.

According to the invention, it has surprisingly been established that the production of trialkylindium is markedly more efficient if a transalkylation is performed in the presence of a carboxylate. High yields may be achieved in the presence of carboxylates, wherein high purity products are simultaneously obtained. The products exhibit no detectable contamination by oxygen. Moreover, the reaction via the carboxylate is more efficient, and the quantity of the trialkylaluminum that is used may be reduced. Without being bound to a theory, it is assumed that the carboxylate forms, with the educts, intermediary complexes or reaction products which positively influence the total reaction.

The carboxylates are used as further components in addition to the organometallic indium and aluminum compounds. They are thus not used as components of organometallic indium and aluminum compounds, i.e., not as an organometallic indium and aluminum compound. The method thus differs significantly from that of WO2014/099171A1, in which indium carboxylates are used as educts.

The carboxylates may, for example, have one, two, or more carboxyl groups per molecule. In a preferred embodiment, the carboxylate is a monocarboxylate. It has been found that the reaction with monocarboxylates is markedly more efficient. Without being bound to a theory, it is assumed that a chelation may occur, with bivalent or higher-valent carboxylates, that negatively affects the reaction course.

In a preferred embodiment, the carboxylate is the one carboxylic acid of formula R'—COOH, wherein R' is a hydrocarbon group. The hydrocarbon group may be an alkyl, aryl, or araryl group having 1 to 20 carbon atoms. The carboxylic acids may be linear or branched. Such hydrocarbon carboxylates are preferred, since they are compatible with the reaction mixture and lead to a good solubility and reaction of the organometallic components. The solvent is thereby preferably a hydrocarbon. The absence of additional polar compounds which might negatively affect the reaction or might contaminate the product is also preferred.

According to the invention, it has surprisingly been found that the reaction proceeds very efficiently in the presence of high-boiling carboxylates. This is advantageous because the trialkylindium product may be separated via sublimation without such high-boiling carboxylates entering into the product. In a preferred embodiment, the carboxylate is therefore the one carboxylic acid of formula R'—COOH, wherein R' is a hydrocarbon group that may be an alkyl, aryl, or araryl group and that has at least 5—preferably, 5 to 20—carbon atoms. The group R' preferably has 5 to 15—in particular, 5 to 12, and, especially preferably, 7—carbon atoms. The carboxylic acids are thereby especially preferably alkanoic acids. These may be linear or branched, wherein branched carboxylic acids are preferred. The carboxylic acids forming the basis of the carboxylates have relatively high boiling points that are generally above 200° C. and do not, or only to a small extent, lead to contaminations of the product purified via sublimation.

The carboxylate is preferably the salt of a metal. In a preferred embodiment, the metal has the oxidation number 1 or 2. In particular, the metal is an alkali or alkaline earth metal. A salt of an alkali metal is especially preferably used—in particular, a sodium or potassium carboxylate.

The carboxylate is preferably one of the formula $[R'COO]_xM$, wherein M is chosen from monovalent and bivalent anions—preferably, metals—and x=1 or 2. In this, x=2, if M is a bivalent metal. The metals are preferably alkali metals or alkaline earth metals, since such metals are generally readily soluble and available. Li, Na, K, Mg, or Ca—in particular, Na or K—are especially preferred.

In a preferred embodiment, the carboxylate has the formula R'—COOM, wherein M is chosen from alkali metal or alkaline earth metal, wherein R' is a hydrocarbon group having to 6 to 15 carbon atoms—in particular, 6 to 12 carbon atoms. The carboxylate is especially preferably a linear or branched octanoate—in particular, a 2-ethylhexanoate, and, in particular, sodium-2-ethylhexanoate—or n-octanoate.

In a preferred embodiment, the carboxylic acid forming the basis of the carboxylate has a boiling point greater than 200° C.—in particular, greater than 250° C. Carboxylates with such high boiling points remain in the reaction mixture upon separation of trialkylindium—in particular, trimethylindium. For example, octanoic acid has a boiling point of approximately 237° C.

The reaction occurs in a solvent. This is selected so that the educts and the carboxylate may be dissolved as well as possible, or at least may be suspended. It is thereby preferred that the solvent be non-polar. In particular, it is preferred that the solvent have no polar groups, such as oxygen-, nitrogen-, or phosphorus-containing groups, and/or O, N, or P atoms.

In a preferred embodiment, the solvent contains hydrocarbons. It especially preferably consists of hydrocarbons. It has been found that the reaction may be performed particularly efficiently in hydrocarbons. The hydrocarbons may thereby be aliphatic or aromatic hydrocarbons. Alkanes are thereby preferably used. For example, these may be chosen from pentane, cyclohexane, decane, heptane, hexane, methylcyclohexane, nonane, octane, or longer-chained hydrocarbons having 10 to 15 carbon atoms. The aromatic hydrocarbons may, for example, be chosen from benzene, toluene, and xylene, or from other mono- or polycyclic aromatics that may be substituted or unsubstituted. Mixtures of the cited hydrocarbons may also be used.

In a preferred embodiment, the solvent consists of hydrocarbons having a boiling point greater than 200° C.—in particular, greater than 300° C. or greater than 400° C. In this embodiment, it is to a great extent advantageous that, in the purification of the product via sublimation, the solvent not be or be only slightly distilled, and the product uncontaminated. It is thereby especially preferred that the solvent have a boiling point above 400° C. Squalane, which has a boiling point of 450° C., is especially suitable.

Without being bound to a theory, the method might proceed according to the following reaction equation (I) if trimethyldiindium trichloride (methylindium sesquichloride), trimethylaluminum, and sodium-2-ethylhexanoate are used as starting materials:

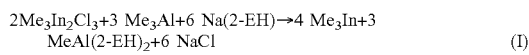

wherein the sodium-2-ethylhexanoate used as a carboxylate was shortened to Na(2-EH); with

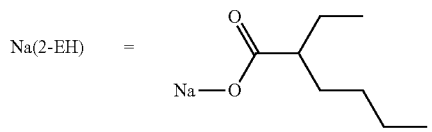

Equation (I) describes an ideal and theoretical reaction. As was stated above, in practice, alkylindium halides normally exhibit stoichiometries that, for example, deviate from the ideal ratio of 3:2:3. Moreover, in practice, secondary products such as carboxylates are obtained in the form of complexes.

A reaction mixture is provided for performing the reaction. This contains the alkylindium halide, the trialkylaluminum, a carboxylate, and a solvent, wherein mixtures of these components may respectively also be used. The solvent is preferably chosen so that the educts present therein are distributed as homogeneously as possible—preferably, as a solution or at least as a dispersion that is as fine as possible. The mixture of the starting materials thereby takes place so that as efficient a reaction as possible takes place, and secondary reactions are avoided—in particular, at the beginning of the reaction.

It is an advantage of the method that the reaction proceeds very efficiently. This leads to the situation that only a relatively small quantity of the trialkylaluminum must be used, which, overall, leads to a significant savings of costs. For example, according to the reaction equation indicated above, only 3 mol aluminum are required for the conversion of 4 mol indium. By contrast, a relatively high excess of aluminum is often required in conventional methods. However, according to the invention, it may be advantageous to use an excess of the aluminum compound in order to improve the yields. In a preferred embodiment, the molar ratio of indium and aluminum in the reaction mixture is between 3:2 and 1:2—in particular, between 3:2 and 2:3. The molar ratio between 3:2 and 1:1—in particular, between 4:3 and 1:1—is especially preferred. It is generally preferred that, in the molar ratio, the reaction mixture contain more indium than aluminum.

It is generally preferred to use a molar excess of carboxylate relative to the indium in order to improve the yields. The molar ratio of the carboxylate to indium in the reaction mixture may, for example, be between 1:1 and 5:1—in particular, between 2:1 and 4:1, and, especially preferably, between 3:2 and 3:1. This is generally non-critical for efficiency reasons, since carboxylate salts are readily and cost-effectively available.

The reaction may be performed at a temperature of 25° C. to 200° C., for example. However, it is preferred that the reaction be performed at a temperature below 100° C.—in particular, below 80° C. or below 70° C. The reaction is preferably performed at a temperature in a range of 25° C. to 100° C.—in particular, in a range of 30° C. to 80° C. or of 50° C. to 70° C. According to the invention, it has been found that a very high yield may be achieved even at a temperature of approximately 60° C.

It is highly advantageous that, according to the invention, an efficient reaction occurs even at such relatively low temperatures. On the one hand, the organometallic compounds used based upon indium are generally thermally labile. Trimethylindium thus tends to decompose exothermally above 120° C. and under development of high pressure. Therefore, for the product yield and the product quality, it is advantageous that the method may be performed at relatively low temperatures. On the other hand, both the organometallic compounds that are used and those to be produced are generally pyrophoric. Therefore, the hazard potential, specifically in the case of application on an industrial scale, may be significantly decreased by setting a low reaction temperature.

The reaction is performed over a period of time, until the educts have entirely or largely reacted. For example, the reaction may be performed over a time period of 20 min to 20 h—in particular, between 30 min and 8 h, or between 30 min and 4 h. Since the reaction proceeds relatively efficiently, reaction times of less than 5 h or less than 3 h may be sufficient.

The reaction preferably takes place under strict exclusion of air and water. Otherwise, unwanted secondary reactions would occur, because the product, trialkylindium, and also the educt, trialkylaluminum, are very pyrophoric.

The reaction into trialkylindium preferably takes place after mixing all starting materials in a single step, and thus without needing to isolate the intermediates, or without additional reactive compounds such as lithium compounds being added subsequently.

The trialkylindium is preferably separated after the end of the reaction. In a preferred embodiment, the trialkylindium is separated via sublimation. The sublimation preferably takes place in a vacuum and at increased temperature—for example, at 100° C. to 200° C. According to known methods, the solid trialkylindium is obtained as a sublimate in a cooled range. In general, the purified trialkylindium may be further purified according to typical methods—for example, via drying or re-sublimation.

The educts may be mixed in arbitrary order. In a preferred embodiment, the reaction comprises the following steps:
  (a) providing a mixture which contains the alkylindium halide, the carboxylate, and the solvent, followed by
  (b) addition of the trialkylaluminum.

It has been found that the reaction proceeds especially efficiently if the trialkylaluminum is added last. It is thereby preferred to add trialkylaluminum in a controlled manner over a longer period of time—for example, by drops. The speed of the addition is adjusted so that the reaction proceeds, overall, in a controlled manner. The trialkylaluminum may preferably react continuously, and does not accumulate in the reaction mixture. In particular, the reaction is adjusted so that the temperature remains constant during the addition of the trialkylaluminum. For example, the addition of the trimethylaluminum may take place over a time period of 30 min to 5 h—in particular, between 30 min and 3 h. It has been found that secondary reactions may be avoided in such a reaction course, and that the yield is especially high.

In a further embodiment, the reaction comprises the following steps:
  (a1) providing a mixture which contains the trialkylaluminum, the carboxylate, and the solvent, followed by
  (b1) addition of the alkylindium halide.

It is thereby preferred that alkylindium halide be added in a controlled manner over a longer period of time, e.g., by drops, analogously to the method described above with steps (a) and (b). In this method control, the fact that alkylindium halides often have relatively low melting points, and therefore may also be added in liquid form, is made use of. The methylindium chloride used in the exemplary embodiments thus has a melting point of approximately 130° C., for example, and could be added by drops in liquid form. This is an additional advantage compared to the use of $InCl_3$ according to the prior art, which possesses a markedly higher melting point.

After steps (a) and (b), or (a1) and (b1), step (c) of the purification of the trialkylindium preferably takes place via sublimation.

The alkylindium halide in isolated form may be used in the reaction. It is also possible to produce the alkylindium halide in a preceding step. The alkylindium halide may either be purified in an additional intermediate step, or the additional conversion to trialkylindium occur in the same reaction vessel. For example, the alkylindium halide—such as an alkylindium sesquichloride—may be produced via reaction of elementary indium with alkyl halides at increased pressure and a temperature of 150 to 200° C. The reaction product produced in such a manner may be mixed directly with the carboxylate and, if applicable, the solvent, followed by the addition of trialkylaluminum, whereby the reaction into trialkylindium begins. It is thereby conceivable to produce alkylindium halide even in the solvent required for the additional reaction.

In a preferred embodiment, the reaction mixture contains no components, i.e., educts, carboxylates, and solvents, that have a boiling point below 200° C.—preferably, below 250° C. or below 300° C. This is especially advantageous, because such high-boiling compounds are not carried off, or are carried off only to an extremely small degree, in the final sublimation of the trialkylindium.

In a preferred embodiment, no additional compounds are contained in the reaction mixture apart from the alkylindium halide, trialkylaluminum, carboxylate, and solvent. In a further embodiment, the reaction mixture may contain additives.

In further embodiments, no compound (apart from the inert gas) that contains nitrogen or phosphorus—in particular, no amines or phosphines—is added to the reaction mixture. Aside from carboxylates, preferably, no additional compound that contains oxygen is added. Preferably, no compound is added that is chosen from elementary metals and metal halides—in particular, indium trihalide or aluminum halides.

In a preferred embodiment, the yield of trialkylindium is greater than 80% in relation to the quantity of indium used. The yield is especially preferably greater than 85%, greater than 90%, or at least 95%. The yield relates, in particular, to the quantity of trialkylindium after the sublimation from the reaction mixture. Such high yields in the production of trialkylindium are atypical, and, in general, are not achieved with conventional reactions.

The purity of the trialkylindium that is obtained in the method is preferably at least 99.99 wt %—in particular, at least 99.999 wt %, and, especially preferably, at least 99.9999 wt %. It has been found that such extraordinarily pure products can be obtained with the method. The purity preferably relates even to the product that is obtained directly via sublimation from the reaction mixture.

The trialkylindium preferably has an oxygen content of less than 2 ppm—preferably, less than 1 ppm, and, especially preferably, less than 0.5 ppm. Such low oxygen fractions are acceptable in MOCVD applications. The trialkylindium produced according to the method thus has an extraordinarily low proportion of oxygen. This was unexpected, because carboxylates are, in principle, an oxygen source, and it could not be assumed that nearly no residues from these would get into the product. According to the invention, it has been found that the oxygen contaminations are so slight that they cannot be detected by means of $^1$H-NMR. The detection limit of this method is approximately 2 ppm.

The highly pure trialkylindium which can be obtained according to the method is suitable, in particular, for use as a precursor compound in the metallo-organic chemical vapor deposition (MOCVD) for deposition of indium-containing layers. In this method, it is used, in particular, in gaseous form, wherein a chemical reaction occurs in the gas phase or on a substrate, and indium and/or an indium compound is deposited. It is thereby extremely advantageous that the trialkylindium has no detectable oxygen contaminants.

The subject matter of the invention is also a method for producing a semiconductor containing indium and/or a coating containing indium, comprising the steps:
 (i) producing trialkylindium according to the method according to the invention, and
 (ii) performing a metallo-organic chemical vapor deposition (MOCVD), wherein the trialkylindium is used as a precursor compound for depositing a coating containing indium onto a substrate.

The method according to the invention achieves the described aim, in contrast to the prior art. A new method for the production of trialkylindium is provided in which the product may be obtained at a high yield of well above 90%. The method is therefore highly efficient and cost-effective. According to the invention, a product of extraordinarily high purity is also obtained in which oxygen contaminants are not detectable. The product is therefore highly suitable as a precursor compound in CVD processes for the production of semiconductors containing indium.

The method also has numerous advantages with regard to the method control. It can be performed in a single reaction mixture and a single reaction step, and therefore is comparatively simple. A relatively small quantity of trialkylaluminum may be used in relation to the alkylindium halide that is used as an educt. The molar ratio of indium to aluminum may thereby be less than 1, or even lower. On the whole, the quantity of organometallic compounds used that are pyrophoric and difficult to handle may thereby be kept small. This is advantageous for both reasons of cost and hazard prevention.

The advantages are achieved because carboxylates are used that are relatively readily available and handled easily. Overall, a markedly improved and simplified method is provided for the production of trialkylindium.

It is an additional advantage that the method may be performed exclusively with compounds, but also with secondary products, that have relatively high boiling points above 200° C. It is thereby ensured that a highly pure product is obtained in the final separation of the trialkyl indium via sublimation.

EXEMPLARY EMBODIMENTS

Example 1

Methylindium chloride of the formula $Me_{2.4}In_2Cl_{3.6}$ (referred to in the following as MIC, produced according to WO2015/024894A1, Example 1.4) was converted into trialkylindium in an inert gas glovebox. The reaction takes place in a 1 L three-necked bottle with tempering jacket.

89.9 g MIC (468 mmol in relation to indium) and 135.5 g sodium-2-ethylhexanoate (815 mmol) are added to 400 mL squalane and stirred vigorously with a KPG stirrer. The mixture is heated via the tempering jacket with a thermocryostat to 60° C. (external temperature control). 29.9 g trimethylaluminum (415 mmol) are added by drops via a dropping funnel at a speed [such] that the temperature remains constant at 60° C. (±2° C.) (approximately 2 h). After the end of the addition, the dropping funnel is exchanged for a cooler with cooling fingers, and the sump is heated to 120° C. The cooler, together with cooling fingers, is cooled to −25° C., and TMI (trimethylindium) is sublimated out of the reaction mixture via application of vacuum. As a sublimate, 70.8 g TMI (443 mmol) are thereby obtained as a crystalline solid (95% yield). No oxygen-based contamination can be identified via $^1$H-NMR.

Example 2

Methylindium chloride of the formula $Me_{2.4}In_2Cl_{3.6}$ (according to Example 1) was converted into trialkylindium in an inert gas glovebox. In a 1 L three-necked flask with tempering jacket, 112.5 g methylindium chloride (587 mmol in relation to indium) and 168.7 g sodium-2-ethylhexanoate (1,015 mmol) are added to 500 g dibenzyltoluene (market name, Marlotherm SH, Sasol company, Germany) as a solvent and stirred with a KPG stirrer. The mixture is heated via the tempering jacket with a thermocryostat to 60° C. (external temperature control). 36.9 g trimethylaluminum (512 mmol) are added by drops via a dropping funnel at a speed [such] that the temperature remains constant at 60° C. (±2° C.) (approximately 1 h). After the end of the addition, the dropping funnel is exchanged for a cooler with cooling fingers, and the sump is heated to 120° C. The cooler, together with cooling fingers, is cooled to −25° C., and TMI (trimethylindium) is sublimated out of the reaction mixture via application of vacuum. As a sublimate, 83.0 g TMI (519 mmol) are thereby obtained as a crystalline solid (88%). No oxygen-based contamination can be identified via $^1$H-NMR.

The invention claimed is:

1. Method for producing trialkylindium, wherein the production takes place in a reaction mixture that contains at least one alkylindium halide, a trialkylaluminum, a carboxylate, and a solvent, wherein the alkyl groups are chosen, independently of one another, from C1-C4 alkyl, wherein the carboxylate has a formula [R'COO]xM wherein
R' is a hydrocarbon group having from 1 to 20 carbon atoms,
M is an alkali metal or an alkaline earth metal, and x=1 or 2.

2. Method according to claim 1, wherein the alkylindium halide has the formula $R_aIn_bX_c$, wherein R is chosen from C1-C4 alkyl; X is chosen from Cl, Br, and I; and
wherein a=1-2, b=1, and c=1-2.

3. Method according to claim 1, wherein the halide is chloride.

4. Method according to claim 1, wherein the alkyl is methyl or ethyl.

5. Method according to claim 1, wherein the alkylindium halide is alkylindium sesquichloride ($R_3In_2C_3$).

6. Method according to claim 1, wherein R' is a hydrocarbon group with 6 to 15 carbon atoms.

7. Method according to claim 6, wherein x=1.

8. Method according to claim 1, wherein the carboxylic acid corresponding to the carboxylate has a boiling point greater than 200° C.

9. Method according to claim 1, wherein the solvent consists of hydrocarbons and/or has a boiling point greater than 400° C.

10. Method according to claim 1, wherein the molar ratio of In:Al in the reaction mixture is between 3:2 and 2:3.

11. Method according to claim 1, wherein the reaction is performed at a temperature of less than 100° C.

12. Method according to claim 1, wherein the trialkylindium is separated out from the reaction mixture via sublimation.

13. Method according to claim 1, wherein the reaction comprises the following steps:
    (a) providing a mixture which contains the alkylindium halide, the carboxylate, and the solvent, and
    (b) addition of the trialkylaluminum.

14. Method according to claim 1, wherein the yield of trialkylindium is greater than 80% relative to the quantity of indium that is used, and/or wherein the trialkylindium has an oxygen content of less than 2 ppm.

15. Method according to claim 1, wherein the carboxylate is chosen from the group consisting of 2-ethylhexanoate, n-octanoate, sodium-2-ethylhexanoate, or their combinations.

16. Method according to claim 1, wherein M is selected from Li, Na, K, Mg, or Ca.

17. Method according to claim 1, wherein R' is a hydrocarbon group with 6 to 12 carbon atoms.

18. Method according to claim 1, wherein the carboxylate is sodium-2-ethylhexanoate.

19. Method for producing a semiconductor containing indium and/or a coating containing indium, comprising the steps:
    (i) producing trialkylindium according to the method of claim 1, and
    (ii) performing a metallo-organic chemical vapor deposition (MOCVD), wherein the trialkylindium is used as a precursor compound for depositing a coating containing indium onto a substrate.

* * * * *